(12) United States Patent
Kemmochi et al.

(10) Patent No.: US 8,326,344 B2
(45) Date of Patent: Dec. 4, 2012

(54) HIGH-FREQUENCY DEVICE AND COMMUNICATIONS APPARATUS

(75) Inventors: Shigeru Kemmochi, Kumagaya (JP); Keisuke Fukamachi, Kumagaya (JP); Kazuhiro Hagiwara, Kumagaya (JP)

(73) Assignee: Hitachi Metals, Ltd., Tokyo (JP)

( * ) Notice: Subject to any disclaimer, the term of this patent is extended or adjusted under 35 U.S.C. 154(b) by 716 days.

(21) Appl. No.: 12/520,965

(22) PCT Filed: Dec. 27, 2007

(86) PCT No.: PCT/JP2007/075199
§ 371 (c)(1),
(2), (4) Date: Jun. 23, 2009

(87) PCT Pub. No.: WO2008/084723
PCT Pub. Date: Jul. 17, 2008

(65) Prior Publication Data
US 2010/0062727 A1 Mar. 11, 2010

(30) Foreign Application Priority Data
Dec. 28, 2006 (JP) .................................. 2006-353757

(51) Int. Cl.
H04B 1/38 (2006.01)
H04M 1/00 (2006.01)
H01L 23/34 (2006.01)
G06F 17/50 (2006.01)

(52) U.S. Cl. ....... 455/550.1; 455/73; 257/728; 716/100; 716/137

(58) Field of Classification Search ............. 455/73, 455/550.1, 561, 575.7, 575.1, 128, 347, 349; 257/421, 728, 798; 438/795, 800; 716/100, 716/110, 126, 133, 137
See application file for complete search history.

(56) References Cited

U.S. PATENT DOCUMENTS 6,928,298 B2 * 8/2005 Furutani et al. ............ 455/553.1
7,904,030 B2 * 3/2011 Uriu et al. ...................... 455/83
(Continued)

FOREIGN PATENT DOCUMENTS
EP 1 473 846 A 11/2004
(Continued)

*Primary Examiner* — Andrew Wendell
(74) *Attorney, Agent, or Firm* — Sughrue Mion, PLLC (57) ABSTRACT

A high-frequency device having high-frequency-signal-treating circuits in and on a laminate substrate comprising pluralities of dielectric layers having conductor patterns, the high-frequency-signal-treating circuits having amplifier circuits and switch circuits; terminals including input and output terminals of high-frequency signals, the power supply terminals of the amplifier circuits and the power supply terminals of the switch circuits being formed on one main surface of the laminate substrate; power supply lines each having one end connected to each of the power supply terminals of the amplifier circuits and power supply lines each having one end connected to each of the power supply terminals of the switch circuits being formed on one dielectric layer to constitute a power supply line layer; a first ground electrode being arranged on the side of the main surface with respect to the power supply line layer, the first ground electrode overlapping at least part of the power supply lines in a lamination direction; a second ground electrode being arranged on the opposite side of the first ground electrode with respect to the power supply line layer, the second ground electrode overlapping at least part of the power supply lines in a lamination direction; and the high-frequency-signal-treating circuits being arranged on the opposite side of the power supply line layer with respect to the second ground electrode.

15 Claims, 4 Drawing Sheets

U.S. PATENT DOCUMENTS

| | | | |
|---|---|---|---|
| 8,000,737 B2 * | 8/2011 | Caimi et al. | 455/550.1 |
| 2002/0034934 A1 * | 3/2002 | Watanabe et al. | 455/318 |
| 2004/0217914 A1 * | 11/2004 | Yamashita et al. | 343/850 |
| 2004/0238857 A1 * | 12/2004 | Beroz et al. | 257/232 |
| 2006/0121874 A1 * | 6/2006 | Block et al. | 455/333 |
| 2006/0286942 A1 | 12/2006 | Okuyama | |
| 2007/0190954 A1 * | 8/2007 | Murakami et al. | 455/132 |

FOREIGN PATENT DOCUMENTS

| | | |
|---|---|---|
| JP | 06-244305 A | 9/1994 |
| JP | 11-261398 A | 9/1999 |
| JP | 11-313003 A | 11/1999 |
| JP | 11-340630 A | 12/1999 |
| JP | 2001-332825 A | 11/2001 |
| JP | 2004-364051 A | 12/2004 |
| JP | 2006-352532 A | 12/2006 |
| WO | 2006/003959 A1 | 1/2006 |
| WO | 2006/112306 A1 | 10/2006 |

* cited by examiner

HIGH-FREQUENCY DEVICE AND COMMUNICATIONS APPARATUS

This application is a National Stage of International Application No. PCT/JP2007/075199 filed Dec. 27, 2007, claiming priority based on Japanese Patent Application No. 2006-353757, filed Dec. 28, 2006, the contents of all of which are incorporated herein by reference in their entirety.

FIELD OF THE INVENTION

The present invention relates to a small high-frequency device used in apparatuses for conducting wireless communications between electronic or electric equipments.

BACKGROUND OF THE INVENTION

Data communications by wireless LAN such as IEEE802.11 are now widely used. Wireless data communications are conducted, for instance, in personal computers (PCs), PC peripherals such as printers, hard disk drives and broadband rooters, electronic apparatuses such as facsimiles, refrigerators, standard-definition televisions (SDTVs), high-definition televisions (HDTVs), digital cameras, digital video cameras and mobile phones, signal-transmitting means in automobiles and aircrafts, etc. In addition to single-band communications, multiband communications have been finding wider applications.

A high-frequency circuit for multiband communications apparatuses using wireless LAN comprises one antenna capable of conducting transmission and reception in two communications systems (IEEE802.11a and IEEE802.11b, and/or IEEE802.11g) having different communications frequency bands, and a high-frequency switch for switching the connection of a transmission circuit and a reception circuit. With wireless apparatuses becoming smaller with higher functions, high-frequency devices have come to have more integrated functions.

WO 2006/003959 discloses a high-frequency device comprising a high-frequency circuit commonly usable for two communications systems, which comprises switch circuits, power amplifier circuits, etc. This high-frequency device is miniaturized by mounting high-frequency-signal-treating circuits such as switch circuits, power amplifier circuits, etc. on a laminate substrate, but it has been found that higher integration makes electrode patterns closer to each other in the laminate substrate, causing interference. For instance, because electrode patterns connected to transmission ports, reception ports, power supply ports, etc. on the rear surface are formed on pluralities of layers, their interference are likely to occur by miniaturization. Particularly when the number of high-frequency-signal-treating circuits such as switch circuits increases, many power supply lines for their control, etc. exist between signal lines, causing much interference.

OBJECT OF THE INVENTION

Accordingly, an object of the present invention is to provide a high-frequency device capable of being miniaturized while effectively preventing interference between power supply lines and signal lines, and a communications apparatus comprising such high-frequency device.

DISCLOSURE OF THE INVENTION

The high-frequency device of the present invention comprises high-frequency-signal-treating circuits in and on a laminate substrate comprising pluralities of rectangular dielectric layers having conductor patterns, said high-frequency-signal-treating circuits having amplifier circuits and switch circuits, terminals including input and output terminals of high-frequency signals, the power supply terminals of the amplifier circuits and the power supply terminals of the switch circuits being formed on one main surface of the laminate substrate, power supply lines each having one end connected each of the power supply terminals of the amplifier circuits and power supply lines each having one end connected to the power supply terminals of the switch circuits being formed on one dielectric layer to constitute a power supply line layer, and pluralities of power supply lines extending in two or more of triangular regions obtained by diagonally quartering the dielectric layer having said power supply line layer, a first ground electrode being arranged on the side of the main surface with respect to the power supply line layer, the first ground electrode overlapping at least part of the power supply lines in a lamination direction, a second ground electrode being arranged on the opposite side of the first ground electrode with respect to the power supply line layer, the second ground electrode overlapping at least part of the power supply lines in a lamination direction, and the high-frequency-signal-treating circuits being arranged on the opposite side of the power supply line layer with respect to the second ground electrode.

With the power supply lines sandwiched by a pair of ground electrodes and extending on the power supply line layer with distance from the high-frequency-signal-treating circuits via one of the ground electrodes, interference between the power supply lines and signal lines for the high-frequency-signal-treating circuits can be prevented, thereby achieving the miniaturization of the high-frequency device without deteriorating high-frequency characteristics.

Signal lines connected to the input and output terminals of high-frequency signals are preferably not formed on the power supply line layer. Without signal lines on the power supply line layer, interference between the signal lines and the power supply lines can be surely suppressed.

The terminals are preferably arranged along the edges of the main surface, with the first ground electrode inside the terminals on the main surface. This structure enables the formation of the terminals and the first ground electrode on the same surface, making another dielectric layer for the first ground electrode unnecessary, resulting in a low-height high-frequency device.

Even when the total number of power supply lines each having one end connected to each of the power supply terminals of the amplifier circuits and power supply lines each having one end connected to each of the power supply terminals of the switch circuits is three or more on the power supply line layer, interference can be prevented sufficiently between power supply lines and signal lines. Having a high degree of freedom in arranging power supply lines on the power supply line layer, the structure of the present invention is suitable particularly when there are a large number of power supply lines.

At least part of the power supply terminals preferably overlap the second ground electrode in a lamination direction. This structure can prevent interference between the high-frequency-signal-treating circuits and the power supply terminals.

The other ends of the power supply lines preferably are connected to the high-frequency-signal-treating circuits through via-electrodes formed in a region overlapping the first ground electrode in a lamination direction. This structure can prevent interference with the input and output terminals of high-frequency signals. Regardless of the positions of the power supply terminals, the connecting position of the power supply lines and the high-frequency-signal-treating circuits can be arranged freely on the power supply line layer, resulting in an improved degree of freedom in the arrangement of the power supply lines.

At least part of the power supply terminals preferably are adjacent to each other. With this structure, the power supply terminals can be gathered, preventing interference between the high-frequency signal terminals and the power supply terminals. When the high-frequency device has a rectangular main surface, the power supply terminals preferably are arranged on the opposing edges of the main surface.

It is preferable that the dielectric layer is rectangular, and that pluralities of power supply lines extend in two or more of triangular regions obtained by diagonally quartering the power supply line layer. This structure enables long power supply lines to extend on the power supply line layer in conformity with the arrangement of the switch circuits and the amplifier circuits, resulting in the miniaturization of the high-frequency device.

Grounded via-electrodes preferably are arranged between power supply lines each having one end connected to each of the power supply terminals of the amplifier circuits and power supply lines each having one end connected to each of the power supply terminals of the switch circuits. This structure can suppress interference among the power supply lines.

At least one signal line connected to the input and output terminals of high-frequency signals may be formed in a region not overlapping the first ground electrode on the power supply line layer in a lamination direction. Even when there are signal lines on a dielectric layer having the power supply line layer, interference between the power supply lines and the signal lines can be prevented by arranging the signal lines in a region other than the region in which the other ends of the power supply lines are gathered (region not overlapping the first ground electrode).

Some of the power supply lines preferably are constituted by a first line portion formed on the opposite side of the power supply line layer with respect to the second ground electrode, and second line portions formed on the power supply line layer and connected to both ends of the first line portion through via-electrodes, the first line portion crossing the other power supply lines on the power supply line layer when viewed from above in a lamination direction.

The high-frequency device preferably comprises a power supply terminal common to pluralities of amplifier circuits. This structure enables the miniaturization of the high-frequency device.

The high-frequency device preferably comprises a low-noise amplifier circuit as the amplifier circuit, one power supply terminal being commonly used for the switch circuits and the low-noise amplifier circuit. This structure enables the miniaturization of the high-frequency device, and the synchronization of the switch circuits and the low-noise amplifier circuit.

The input and output terminals of high-frequency signals and the power supply terminals preferably are arranged via other terminals. This structure can suppress interference between the power supply terminals and the input and output terminals of high-frequency signals.

It is preferable that the switch circuit switches the connection of an antenna terminal to the input and output terminals of the high-frequency signals, and that the amplifier circuit comprises a high-frequency amplifier circuit for amplifying transmitting signals input to the input terminal, and/or a low-noise amplifier circuit for amplifying received signals input through the antenna terminal.

The communications apparatus of the present invention comprises the above high-frequency device. With the above high-frequency device, the communications apparatus can be miniaturized.

DESCRIPTION OF THE PREFERRED EMBODIMENTS

The high-frequency device of the present invention is a laminate substrate comprising pluralities of dielectric layers having conductor patterns, which has high-frequency-signal-treating circuits. The high-frequency-signal-treating circuits include a switch circuit for switching high-frequency signals paths, an amplifier circuit such as a semiconductor element for amplifying high-frequency signals, etc. The switch circuit is preferably an FET (field-effect transistor) switch such as a Ga—As switch, etc., which has two or more drive power supplies and/or control power supplies in total. The amplifier circuit is preferably a high-frequency amplifier circuit for amplifying transmitting signals, a low-noise amplifier circuit for amplifying received signals, etc., which has two or more drive power supplies and/or control power supplies in total. The high-frequency amplifier circuit may have a detection circuit for monitoring output power. Because the output signal of the detection circuit is DC voltage, it can be treated like a power supply line. Explanation will be made below with respect to an example having both high-frequency amplifier circuit and low-noise amplifier circuit, without intension of restriction.

Figure 1:
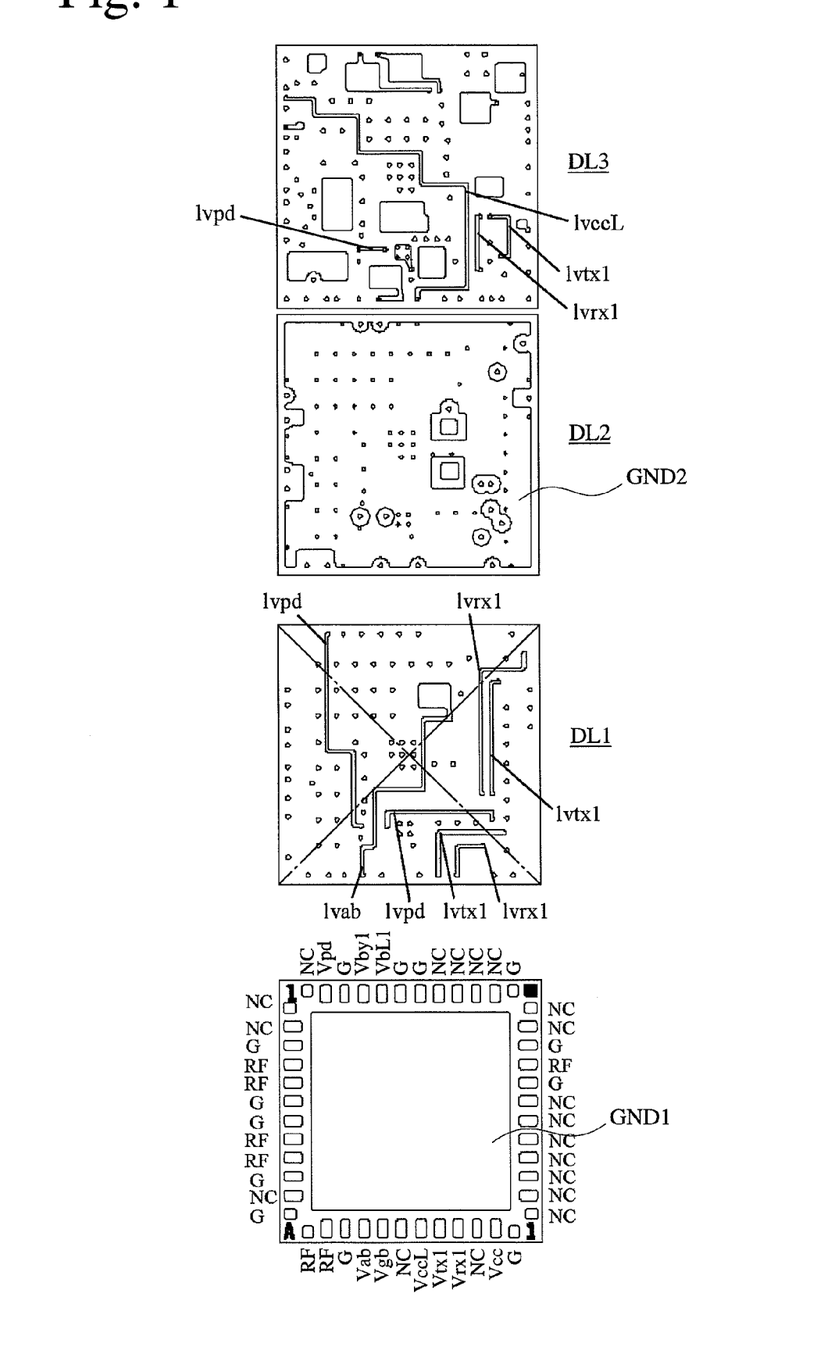
FIG. 1 is a development view showing part of the high-frequency device according to one embodiment of the present invention.
Figure 3:
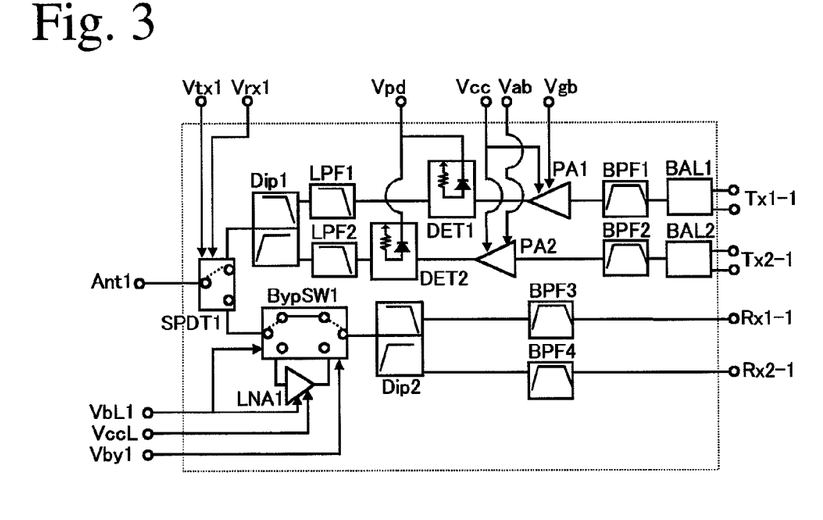
FIG. 3 is a block diagram showing the circuit of the high-frequency device according to one embodiment of the present invention.

The high-frequency device according to one embodiment of the present invention has a laminate substrate comprising 20 dielectric layers on which conductor patterns constituting the circuit shown in FIG. 3 are formed. FIG. 1 shows electrode patterns arranged on three lowest layers in the above laminate substrate, and terminals (input and output terminals of high-frequency signals, and power supply terminals for high-frequency-signal-treating circuits) arranged on one main surface (rear surface) along its edges at high density. The arrangement of terminals on the rear surface are viewed from above in a lamination direction.

The circuit for treating high-frequency signals shown in FIG. 3 is a one-transmission-one-reception-type, dual-band wireless LAN front-end module, which comprises an antenna terminal Ant1 connected to an antenna, a first switch circuit SPDT1 connected to the antenna terminal Ant1 for switching the connection of input terminals (transmission terminals)

Tx1-1, Tx2-1 and output terminals (reception terminals) Rx1-1, Rx2-1 for high-frequency signals, a first high-frequency amplifier circuit PA1 for amplifying high-frequency transmitting signals input to the input terminal Tx1-1, a second high-frequency amplifier circuit PA2 for amplifying transmitting signals input to the input terminal Tx2-1, and a first low-noise amplifier circuit LNA1 for amplifying received signals input through the antenna terminal Ant1 and output to the output terminal Rx1-1 or Rx2-1. A first diplexer circuit Dip1 is connected to the first switch circuit SPDT1. The first diplexer circuit comprises a lower-frequency-side filter and a higher-frequency-side filter, the lower-frequency-side filter being connected to a first lowpass filter LPF1, the first detection circuit DET1, the first high-frequency amplifier circuit PA1, a first bandpass filter BPF1, a first balanced-to-unbalanced conversion circuit BAL1 and the input terminal Tx1-1 in this order, and the higher-frequency-side filter being connected to a second lowpass filter LPF2, a second detection circuit DET2, the second high-frequency amplifier circuit PA2, a second bandpass filter BPF2, a second balanced-to-unbalanced conversion circuit BAL2 and the input terminal Tx2-1 in this order. The first switch circuit SPDT1 is connected to a second diplexer circuit Dip2 via a parallel circuit comprising the first low-noise amplifier circuit LNA1 and a first bypass switch circuit BypSW1. The second diplexer circuit comprises a lower-frequency-side filter and a higher-frequency-side filter, the lower-frequency-side filter being connected to a third bandpass filter BPF3 and the output terminal Rx1-1 in this order, and the higher-frequency-side filter being connected to a fourth bandpass filter BPF4 and the output terminal Rx2-1 in this order.

As shown in FIG. 1, terminals including the input and output terminals of high-frequency signals (represented by RF together with the antenna terminal), and the power supply terminals Vtx1, Vrx1, Vcc, Vab, Vgb, Vpd, VccL, VbL1, Vby1 of the high-frequency-signal-treating circuits are formed on the rear surface of the laminate substrate. NC represents dummy terminals. Because the detection output terminals Vpd of the detection circuits DET1, DET2 are on a DC signal line, they are included in power supply terminals for convenience. The power supply terminals Vtx1, Vrx1 are terminals for controlling the first switch circuit SPDT1. For instance, when 3 V and 0 V are respectively applied to Vtx1 and Vrx1, the first switch circuit SPDT1 is controlled such that the first antenna terminal Ant1 is connected to the input terminals Tx1-1, Tx2-1 for high-frequency signals. Also when 0 V and 3 V are respectively applied to Vtx1 and Vrx1, the first switch circuit SPDT1 is controlled such that the first antenna terminal Ant1 is connected to the output terminals Rx1-1, Rx2-1 for high-frequency signals.

The power supply terminal Vcc is a common power supply terminal for the first and second high-frequency amplifier circuits PA1 and PA2. With one power supply terminal commonly used for pluralities of amplifier circuits, the number of terminals is reduced, enabling the miniaturization of the high-frequency device. The power supply terminal Vgb is a power supply terminal used for controlling the ON/OFF of the first high-frequency amplifier circuit PA1. For instance, when 2.8 V is applied to Vgb with 3.3 V applied to the power supply terminal Vcc, the first high-frequency amplifier circuit PA1 is turned on to amplify the input high-frequency signals. The power supply terminal Vab is a power supply terminal used for controlling the ON/OFF of the second high-frequency amplifier circuit PA2. For instance, when 2.8 V is applied to Vab with 3.3 V applied to the power supply terminal Vcc, the second high-frequency amplifier circuit PA2 is turned on to amplify the input high-frequency signals.

The power supply terminal VccL is a drive power supply terminal for the first low-noise amplifier circuit LNA1. The power supply terminal VbL1 is a common terminal used for controlling the ON/OFF of the first low-noise amplifier circuit LNA1 and controlling the first bypass switch circuit BypSW1. With a common power supply terminal for the switch circuit and the low-noise amplifier circuit connected thereto, the number of terminals is reduced, enabling the miniaturization of the high-frequency device. The power supply terminal Vby1 also is a terminal used for controlling the first bypass switch circuit BypSW1. For instance, when 3 V and 0 V are respectively applied to VbL1 and Vby1, the first bypass switch circuit BypSW1 is controlled, such that the input side of the first low-noise amplifier circuit LNA1 is connected to the first switch circuit SPDT1, and that the output side of the first low-noise amplifier circuit LNA1 is connected to the second diplexer circuit Dip2. In this case, when 3 V is applied to VccL, the first low-noise amplifier circuit LNA1 is turned on to amplify the input high-frequency signals. Also, when 0 V and 3 V are respectively applied to VbL1 and Vby1, the first bypass switch circuit BypSW1 is controlled, such that the first switch circuit SPDT1 is connected to the second diplexer circuit Dip2 without passing the first low-noise amplifier circuit LNA1. In this case, even when 3 V is applied to VccL, the first low-noise amplifier circuit LNA1 is in an OFF state, because 0 V is applied to VbL1 connected to the first low-noise amplifier circuit LNA1.

Formed on a dielectric layer DL1 are a power supply line lvab having one end connected to the power supply terminal Vab of the amplifier circuit, a power supply line lvrx1 having one end connected to the power supply terminal Vrx1 of the switch circuit, and a power supply line lvtx1 having one end connected to the power supply terminal Vtx1 of the switch circuit. Each power supply line lvrx1, lvtx1 has a first line portion (indicated as lvrx1 and lvtx1 in DL3) formed on the layer DL3 on the opposite side of the power supply line layer with respect to the second ground electrode GND2, and two second line portions formed on the power supply line layer and connected to both ends of the first line portion through via-electrodes. Likewise, a DC signal line lvpd having one end connected to the detection output terminal Vpd also has a first line portion formed on the layer DL3 on the opposite side of the power supply line layer with respect to the second ground electrode GND2, and two second line portions formed on the power supply line layer and connected to both ends of the first line portion through via-electrodes. The connected first and second line portions constitute one power supply line. Accordingly, the power supply line layer on the dielectric layer DL1 has three power supply lines. If the DC signal line lvpd having one end connected to the detection output terminal Vpd is included in the power supply line for convenience, the power supply line layer on the dielectric layer DL1 has four power supply lines.

The first line portion of the power supply line lvtx1 is crossing the power supply line lvtx1 on the power supply line layer, when viewed in a lamination direction. The first line portion of the power supply line lvpd is crossing the power supply line lvab on the power supply line layer, when viewed in a lamination direction. Only first portions crossing the power supply lines are arranged on the opposite side of the power supply line layer with respect to the second ground electrode, and second portions on both sides thereof are arranged on the power supply line layer, thereby suppressing interference with other electrodes such as grounded capacitance electrodes, etc. Such structure is suitable when the power supply lines cannot avoid crossing. In this case, a third ground electrode is preferably arranged on a layer on the opposite side of the second ground electrode with respect to the first line portions, such that the third ground electrode overlaps the first line portions. For instance, a wide ground electrode like the second ground electrode may be formed on a layer DL4 (not shown) adjacent to DL3. With electrode patterns for grounded capacitors for high-frequency treating circuits formed on the layer DL3 sandwiched by the ground electrodes as shown in FIG. 1, the high-frequency device can be miniaturized.

A first ground electrode GND1 overlapping at least part of the above power supply lines in a lamination direction is formed on the rear surface, and a second ground electrode GND2 overlapping at least part of the above power supply lines in a lamination direction is formed on the upper dielectric layer DL2. In this example, the first and second ground electrodes GND1, GND2 cover substantially the entire power supply line layer.

High-frequency-signal-treating circuits such as the first switch circuit SPDT1, the first and second high-frequency amplifier circuits PA1, PA2, the low-noise amplifier circuit LNA1, etc. are arranged above the dielectric layer DL3 on the opposite side of the power supply line layer with respect to the second ground electrode GND2. The high-frequency signal lines are connected to conductor patterns above the second ground electrode GND2 through via-electrodes.

Accordingly, the high-frequency signal lines are not formed on the power supply line layers, except for electrodes accompanying the via-electrodes (electrodes formed around the via-electrodes in connection with their formation, etc.). Some of the power supply terminals are connected directly to the high-frequency-signal-treating circuits through via-electrodes. With the power supply line layer sandwiched by a pair of ground electrodes without interposing other layers having high-frequency signal lines, the arrangement of the power supply lines has a high degree of freedom with suppressed interference between the power supply lines and signal lines, thereby contributing to the miniaturization of the high-frequency device.

As described above, the drive power supply lines and control power supply lines of the high-frequency-signal-treating circuits, and the DC signal lines of the detection output terminals are formed on the power supply line layer. Power supply lines lvrx1, lvtx1, lvab, lvpd each having one end connected to each power supply terminal Vrx1, Vtx1, Vab, Vpd are bent on the power supply line layer, with their other ends connected to the high-frequency-signal-treating circuits on an upper layer through via-electrodes distant from the above power supply terminals. As a result, there can be larger gaps between the other ends of the power supply lines than between the power supply terminals and the input/output terminals of signals. If necessary, the power supply lines may extend to the high-frequency-signal-treating circuits above the second ground electrode GND2.

When a choke coil is formed by power supply lines that can be arranged without restriction in the power supply line layer, high-frequency noise can be removed from the power supply lines upstream of the high-frequency-signal-treating circuits. Via-electrodes are formed in the notches and gaps of the second ground electrode GND2. The first ground electrode GND1 is preferably formed on a rear surface of a portion of the dielectric layer DL1 overlapping the notches and gaps of the second ground electrode GND2 in a lamination direction, to prevent interference with the outside.

To prevent interference between the power supply terminals and the signal terminals, the terminals RF and the power supply terminals are arranged via other terminals such as ground terminals G, dummy terminals NC, etc. A first, rectangular ground electrode GND1 having a large area is arranged inside the terminals on the rear surface. Gaps between the first ground electrode GND1 and the terminals are substantially the same as the terminal gaps. Although the first ground electrode GND1 may be formed in the laminate substrate, its formation on the rear surface having terminals makes the height of the high-frequency device smaller. Because some power supply terminals Vab, Vpd, Vtx1, Vrx1 overlap the second ground electrode GND2 in a lamination direction, it is possible to suppress interference between these power supply terminals and the high-frequency-signal-treating circuits above the second ground electrode GND2.

To suppress interference between the signal terminals and the signal lines, the power supply terminals are preferably arranged in a gathered manner. Accordingly, some of the power supply terminals Vtx1, Vrx1 are adjacent to each other. The power supply terminals also are arranged on the opposing sides of the rectangular rear surface (upper and lower sides in FIG. 1). This makes it possible to gather high-frequency signal terminals such as the input/output terminals, the antenna terminal, etc. on the other opposing sides (lateral sides in FIG. 1), suppressing interference between the power supply terminals and the high-frequency signal terminals. In conventional high-frequency devices, the gathering of power supply terminals provides a structure in which the wiring of elements mounted on the surface are entangled with high-frequency signal lines, sacrificing the isolation of power supply lines from high-frequency signal lines or the size of the high-frequency device. However, with the power supply line layer sandwiched by ground electrodes, the power supply terminals can be arranged in a gathered manner, securing isolation between the power supply lines and the high-frequency signal lines.

Gaps between the other ends of the power supply lines can be larger than those between adjacent power supply terminals. Both ends of the power supply lines can be positioned on different sides, enabling the complicated arrangement of long power supply lines, and thus achieving the isolation of power supply lines from high-frequency signal lines and the miniaturization of the high-frequency device.

As shown in FIG. 1, when the power supply line layer is divided to four triangular regions with two diagonal lines, the power supply lines lvpd extend in four regions, the power supply lines lvab and lvrx1 extend in three regions, and the power supply lines lvtx1 extend in two regions. Because switch circuits and amplifier circuits are mostly arranged on the entire mounting surface, it is likely that their connecting terminals are largely distant from the power supply terminals. In this case, when the power supply lines are formed on a dielectric layer having the high-frequency signal lines, interference occurs between the high-frequency signal lines and the power supply lines. Avoiding such interference provides a larger high-frequency device. On the other hand, when long power supply lines extend in two or more of triangular regions obtained by diagonally quartering the power supply line layer as shown in FIG. 1, power supply lines connected to the power supply terminals arranged on one side of the rear surface can extend close to the other side. As a result, even when the power supply terminals are gathered on one side, the arrangement of the power supply lines has an extremely high degree of freedom, preventing interference between the high-frequency signal lines and the power supply lines without making the high-frequency device larger. At least one power supply line preferably extends in three or more of the quartered triangular regions.

On the dielectric layer DL1, via-electrodes (indicated by small circles) are arranged between the power supply line lvab of the amplifier circuit, whose one end is connected to the power supply terminal Vab, and the power supply line lvtx1 of the switch circuit, whose one end is connected to the power supply terminal Vtx1. The via-electrodes are connected to the first and second ground electrodes GND1, GND2, suppressing interference between the power supply line of the amplifier circuit and the power supply line of the switch circuit.

Figure 2:
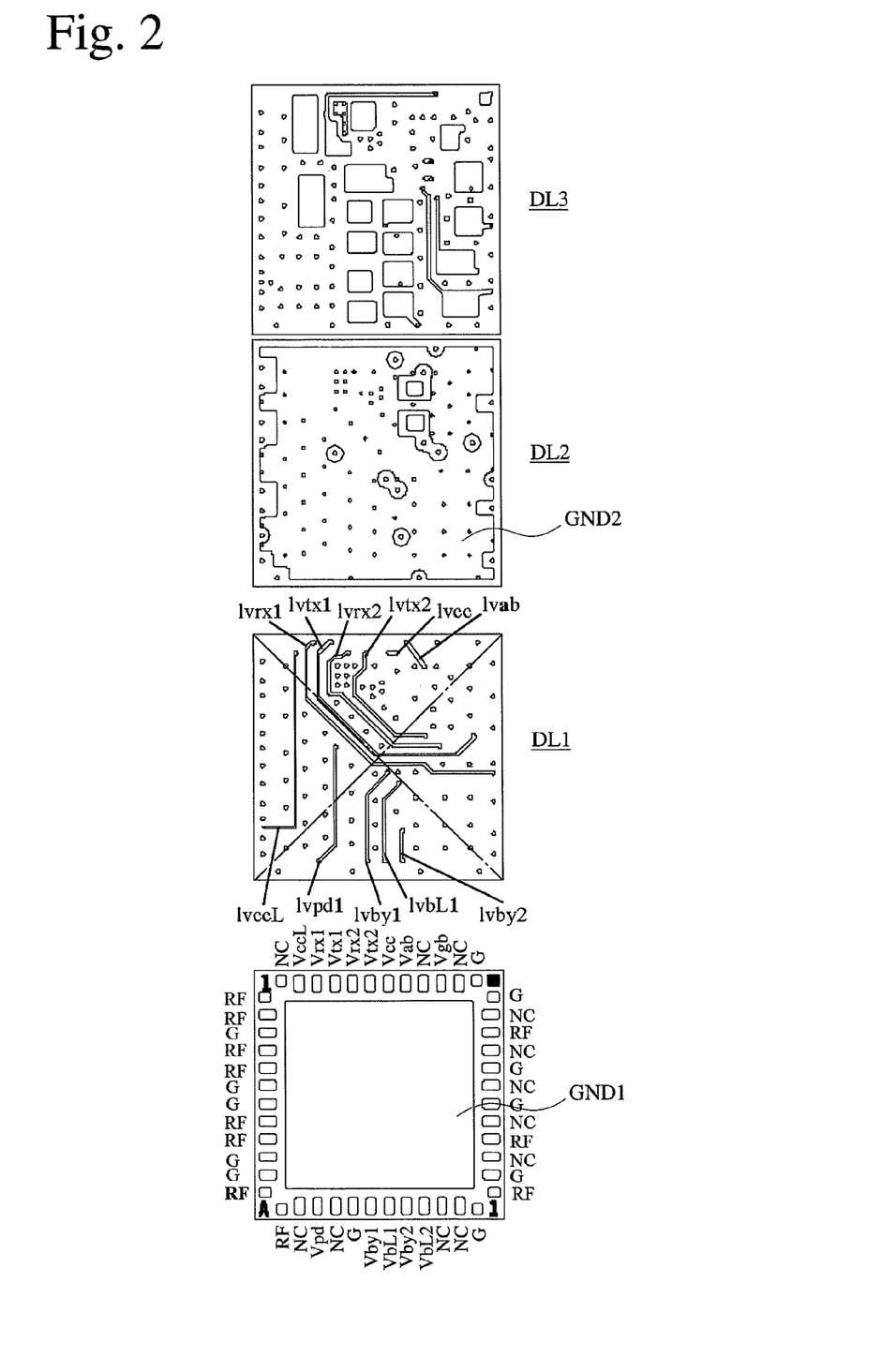
FIG. 2 is a development view showing part of the high-frequency device according to another embodiment of the present invention.
Figure 4:
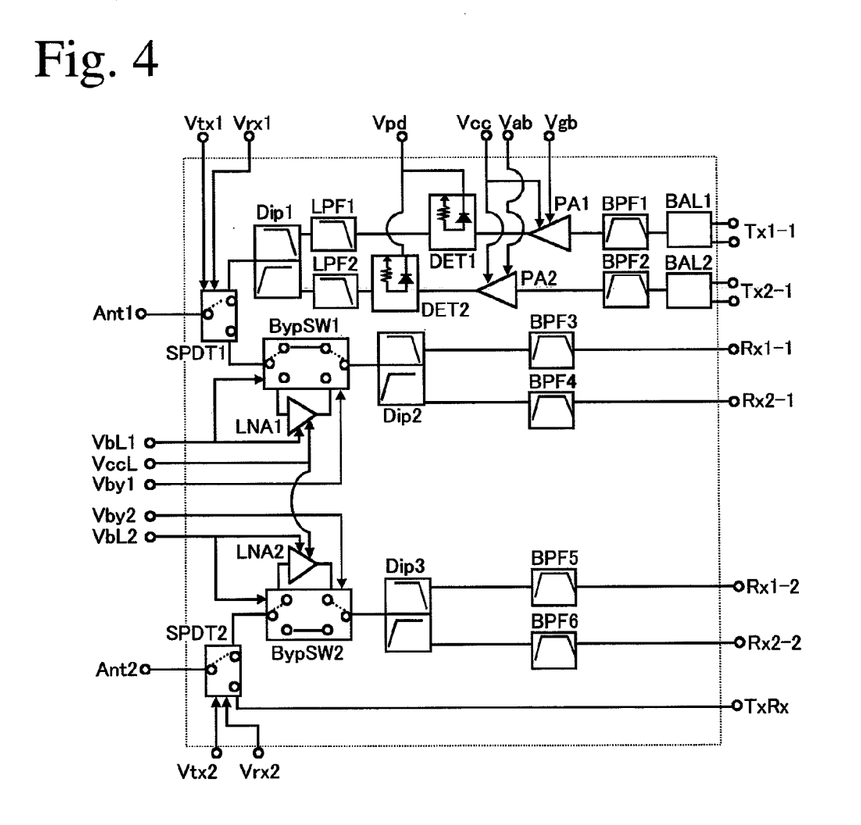
FIG. 4 is a block diagram showing the circuit of the high-frequency device according to another embodiment of the present invention.

The high-frequency device according to another embodiment of the present invention shown in FIG. 2 has a laminate substrate comprising 24 dielectric layers, on which conductor patterns constituting the high-frequency circuit shown in FIG. 4 are formed. FIG. 2 shows electrode patterns formed on three lowest layers and terminals formed on the rear surface. The arrangement of the terminals on the rear surface is viewed from above in a lamination direction.

The high-frequency circuit shown in FIG. 4 is a one-transmission-two-reception-type, dual-band wireless LAN front-end module constituted by adding a high-frequency sub-circuit (called "second high-frequency sub-circuit" below) as a receiving path to the high-frequency circuit shown in FIG. 3. Because a portion other than the second high-frequency sub-circuit, which is called "first high-frequency sub-circuit" below, has the same structure as shown in FIG. 3, its explanation will be omitted. The second high-frequency sub-circuit comprises a second antenna terminal Ant2 connected to a second antenna different from the first antenna for the first high-frequency sub-circuit, and a second low-noise amplifier circuit LNA2 for amplifying received signals input through the second antenna terminal Ant2 and output to the terminal Rx1-2 or Rx2-2. The antenna terminal Ant2 is connected to the second switch circuit SPDT2, which is connected to a third diplexer circuit Dip3 via a parallel circuit comprising the second low-noise amplifier circuit LNA2 and a second bypass switch circuit BypSW2. The third diplexer circuit comprises a lower-frequency-side filter and a higher-frequency-side filter, the lower-frequency-side filter being connected to a fifth bandpass filter BPF5 and the output terminal Rx1-2 in this order, and the higher-frequency-side filter being connected to a sixth bandpass filter BPF6 and the output terminal Rx2-2 in this order. Another terminal of the second switch circuit SPDT2 is connected to an input/output terminal TxRx.

As shown in FIG. 2, terminals including the input and output terminals of high-frequency signals (indicated by RF together with the antenna terminal), and the power supply terminals Vtx1, Vrx1, Vcc, Vab, Vgb, Vpd, VccL, VbL1, Vby1, Vtx2, Vrx2, VbL2, Vby2 of the high-frequency-signal-treating circuits are formed on the rear surface of the laminate substrate. Because the power supply terminals Vtx1, Vrx1, Vcc, Vab, Vgb, Vpd, VbL1, Vby1 are the same as shown in FIG. 3, their explanation will be omitted. The power supply terminals Vtx2 and Vrx2 are those used for controlling the second switch circuit SPDT2. For instance, when 3 V and 0 V are respectively applied to Vtx2 and Vrx2, the second switch circuit SPDT2 is controlled, such that the second antenna terminal Ant2 is connected to the input/output terminal TxRx of high-frequency signals. When 0 V and 3 V are respectively applied to Vtx2 and Vrx2, the second switch circuit SPDT2 is controlled, such that the second antenna terminal Ant2 is connected to the output terminals Rx1-2 and Rx2-2 of high-frequency signals.

The power supply terminal VccL is a common drive power supply terminal for the first and second low-noise amplifier circuits LNA1 and LNA2. The power supply terminal VbL2 is a common power supply terminal used for controlling the ON/OFF of the second low-noise amplifier circuit LNA2 and controlling the second bypass switch circuit BypSW2. The power supply terminal Vby2 also is a power supply terminal used for controlling the second bypass switch circuit BypSW2. For instance, when 3 V and 0 V are respectively applied to VbL2 and Vby2, the second bypass switch circuit BypSW2 is controlled, such that the input side of the second low-noise amplifier circuit LNA2 is connected to the second switch circuit SPDT2, and that the output side of the second low-noise amplifier circuit LNA2 is connected to the third diplexer circuit Dip3. In this case, when 3 V is applied to VccL, the second low-noise amplifier circuit LNA2 is in an ON state, amplifying the input high-frequency signals. When 0 V and 3 V are respectively applied to VbL2 and Vby2, the second bypass switch circuit BypSW2 is controlled, such that the second switch circuit SPDT2 is connected to the third diplexer circuit Dip3 without passing the second low-noise amplifier circuit LNA2. In this case, even when 3 V is applied to VccL, the second low-noise amplifier circuit LNA2 is in an OFF state because 0 V is applied to VbL2 connected to the control voltage terminal of the second low-noise amplifier circuit LNA2. With a power supply terminal commonly used for the switch circuit and the low-noise amplifier circuit, the number of terminals is reduced, making it easy to control the switch circuit and the low-noise amplifier circuit.

The power supply lines lvrx1, lvtx1, lvrx2, lvtx2, lvcc, lvab, lvccL, lvpd1, lvby1, lvbL1 and lvby2 each having one end connected to each of the power supply terminals Vrx1, Vtx1, Vrx2, Vtx2, Vcc, Vab, VccL, Vpd, Vby1, VbL1 and Vby2 are formed on one dielectric layer DL1 to constitute a power supply line layer. The first ground electrode GND1 overlapping at least part of the power supply lines in a lamination direction is formed on the rear surface of the laminate substrate, and the second ground electrode GND2 overlapping at least part of the power supply lines in a lamination direction is formed on a dielectric layer DL2 (on the opposite side of the rear surface in a lamination direction) above the dielectric layer DL1. High-frequency-signal-treating circuits such as the switch circuits SPDT1, SPDT2, the high-frequency amplifier circuits PA1, PA2, the low-noise amplifier circuits LNA1, LNA2, etc. are arranged on layers (on the opposite side of the power supply line layer via the second ground electrode GND2) above the dielectric layer DL3.

With the first and second low-noise amplifier circuits LNA1, LNA2 commonly using the power supply line lvccL connected to the power supply terminal VccL, the miniaturization of the high-frequency device is achieved due to the reduction of the number of power supply lines, and interference is suppressed. The first low-noise amplifier circuit LNA1 and the first bypass switch circuit BypSW1 commonly use the power supply line lvbL1 connected to the power supply terminal VbL1. The commonly used power supply line may be branched on a layer above the power supply line layer or the second ground electrode. Although a switch circuit commonly using the low-noise amplifier circuit and the power supply terminal is a bypass switch circuit in the embodiment shown in FIGS. 2 and 4, the switch circuit SPDT1 connected to the antenna terminal Ant1 for switching transmission and reception and the low-noise amplifier circuit LNA1 may commonly use a power supply terminal. Likewise, the switch circuit SPDT2 connected to the antenna terminal Ant2 for switching transmission and reception and the low-noise amplifier circuit LNA2 may commonly use a power supply terminal.

The power supply lines lvrx1, etc. each having one end connected to each of the power supply terminals Vrx1, etc. extend from the power supply terminals while being bent on the power supply line layer, and their other ends are connected to the high-frequency-signal-treating circuits on upper layers through via-electrodes distant from the above power supply terminals. As in the embodiment shown in FIG. 1, the power supply terminals of the amplifier circuits and some of the power supply terminals VccL, Vrx1, Vtx1, Vrx2, Vtx2, Vcc and Vab of the switch circuits are adjacent to each other. The power supply terminals are arranged on opposing sides (upper and lower sides in FIG. 2) of the rectangular rear surface. With this structure, high-frequency signal terminals such as input terminals, output terminals, antenna terminals, etc. can be gathered on the other opposing sides (lateral sides in FIG. 2), suppressing interference between the power supply terminals and the high-frequency signal terminals.

On the dielectric layer DL1, via-electrodes (shown by small circles) are arranged between the power supply lines lvtx1, lvrx2 of different switch circuits, etc. The via-electrodes are connected to the first and second ground electrodes GND1, GND2, suppressing interference between the power supply lines of the amplifier circuits and the power supply lines of the switch circuits. The arrangement effects of the power supply lines and the power supply terminals are the same as in the embodiment shown in FIG. 1.

In the embodiment shown in FIGS. 2 and 4, the power supply line layer has 11 power supply lines connected to the high-frequency amplifier circuits, the low-noise amplifier circuits and the switch circuits. Some of the power supply lines are as long as half or more of one side of the rear surface. The power supply line layer ensures a high degree of freedom in the arrangement of a large number of power supply lines. As in FIG. 1, pluralities of power supply lines extend in two or more of triangular regions obtained by diagonally quartering the power supply line layer. Specifically, the power supply lines lvrx1 extend in three triangular regions, and the power supply lines lvtx1, lvrx2, lvtx2, lvccL and lvpd1 extend in two triangular regions.

Figure 5:
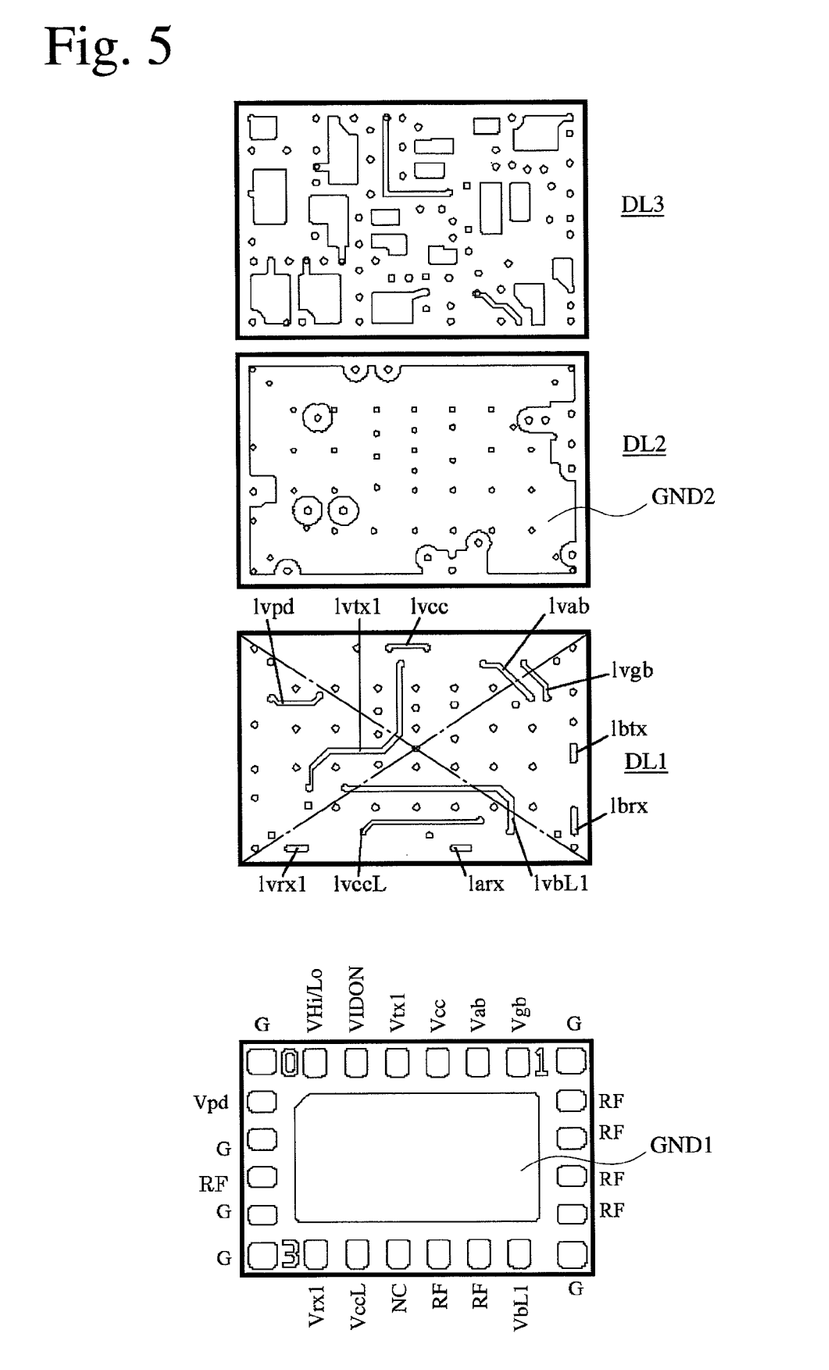
FIG. 5 is a development view showing part of the high-frequency device according to a further embodiment of the present invention.

FIG. 5 shows a high-frequency device according to a further embodiment of the present invention. This high-frequency device is a one-transmission-one-reception-type, dual-band, wireless LAN front-end module comprising the same high-frequency circuits as in the embodiments shown in FIGS. 1 and 3. FIG. 5 shows electrode patterns formed on three lowest layers and terminals on a rear surface. The arrangement of terminals on the rear surface is viewed from above in a lamination direction.

Power supply lines lvrx1, lvtx1, lvcc, lvab, lvgb, lvccL and lvbL1 each having one end connected to each of the power supply terminals Vrx1, Vtx1, Vcc, Vab, Vgb, VccL and VbL1 and the detection output terminals Vpd, and a DC signal line lvpd are formed on a dielectric layer DL1 to constitute a power supply line layer. As in FIG. 1, pluralities of power supply lines extend in two or more of triangular regions obtained by diagonally quartering the power supply line layer. Specifically, the power supply line lvbL1 extends in three regions, and the power supply lines lvab, lvgb and lvtx1 extend in two regions.

The embodiment shown in FIG. 5 differs from the first embodiment in that signal lines lbtx, lbrx and larx connected to the input or output terminal of high-frequency signals are formed on the power supply line layer. These signal lines are formed in a region that does not overlap the first ground electrode GND1 in a lamination direction. In this structure, the signal lines are distant from a region overlapping the first ground electrode GND1, in which the other ends of the power supply lines gather, preventing interference between the signal lines and the power supply lines. To prevent interference between the signal lines and the power supply lines surely, however, it is advantageous to form only power supply lines on the power supply line layer.

The high-frequency device of the present invention is constituted by a laminate substrate (ceramic laminate substrate device), which can be formed, for instance, by printing each green sheet as thick as 10-200 μM made of dielectric ceramics sinterable at as low temperatures as 1000° C. or lower (LTCC, low-temperature-co-fired ceramics) with a conductive paste of low-resistivity Ag, Cu, etc. to form electrode patterns constituting the above high-frequency circuits, integrally laminating and sintering them. The dielectric ceramics preferably have, for instance, (a) a composition comprising Al, Si and Sr as main components, and Ti, Bi, Cu, Mn, Na, K, etc. as sub-components, (b) a composition comprising Al, Si and Sr as main components, and Ca, Pb, Na, K, etc. as sub-components, (c) a composition comprising Al, Mg, Si and Gd, or (d) a composition comprising Al, Si, Zr and Mg. The dielectric ceramics preferably have dielectric constants of about 5-15. Apart from the dielectric ceramics, resins or composite materials of resins and dielectric ceramic powder may be used. Patterns of high-temperature-sinterable metals such as tungsten, molybdenum, etc. may be formed on an alumina-based, dielectric ceramic substrate, and integrally sintered according to an HTCC (high-temperature-co-fired ceramic) technology.

When the high-frequency device such as a front-end module, etc. is constituted by the ceramic laminate substrate, electrode patterns for inductance elements, capacitance elements, power supply lines and ground electrodes, and via-electrodes are formed on each layer. Mainly, diplexer circuits, bandpass filter circuits, lowpass filter circuits and balanced-to-unbalanced conversion circuits are formed in the ceramic laminate substrate. Semiconductor elements for single-pole, double-throw switches (SPDT switches or diode switches), high-frequency amplifier circuits PA, chip capacitors, chip resistors and chip inductors for low-noise amplifier circuits LNA, etc. mounted on the ceramic laminate substrate are connected to electrode patterns in the ceramic laminate substrate by wire-bonding, LGA, BGA, etc.

Pluralities of ceramic green sheets having electrode patterns of Ag were integrally laminated, and sintered at about 900° C. to form a laminate substrate, on which semiconductor elements for switch circuits, high-frequency amplifier circuits and low-noise amplifiers, chip capacitors, chip resistors and chip inductors are mounted, to obtain the high-frequency device of 7 mm×7 mm×1.4 mm according to the embodiment shown in FIG. 1. This high-frequency device was 25% smaller than those having power supply lines without a power supply line layer, providing a front-end module with less interference between power supply lines and RF circuits, and improved characteristics.

The high-frequency device of the present invention is suitable for wireless communications apparatuses of a MIMO (multi-input, multi-output) type needing many signal lines and power supply lines. The MIMO type includes a SIMO (single-input, multi-output) type such as a one-transmission, two-reception type. The above high-frequency device contributes to the miniaturization and cost reduction of communications apparatuses. The above high-frequency device can be used widely for mobile equipments, personal computers, etc. having wireless communications functions.

EFFECT OF THE INVENTION

The high-frequency device of the present invention having high-frequency-signal-treating circuits in and on a laminate substrate comprising pluralities of dielectric layers having conductor patterns has reduced interference between power supply lines and signal lines, and can be miniaturized without deteriorating high-frequency characteristics. The use of such high-frequency devices provides the miniaturization of communications apparatuses.

What is claimed is:

1. A high-frequency device having high-frequency-signal-treating circuits in and on a laminate substrate comprising pluralities of rectangular dielectric layers having conductor patterns, said high-frequency-signal-treating circuits having amplifier circuits and switch circuits;
   terminals including input and output terminals of high-frequency signals, power supply terminals of said amplifier circuits and power supply terminals of said switch circuits being formed on one main surface of said laminate substrate;
   power supply lines each having one end connected to each of the power supply terminals of said amplifier circuits and power supply lines each having one end connected to the power supply terminals of said switch circuits being formed on one dielectric layer to constitute a power supply line layer, and pluralities of power supply lines extending in two or more of triangular regions obtained by diagonally quartering the dielectric layer having said power supply line layer;
   a first ground electrode being arranged on the side of said main surface with respect to said power supply line layer, said first ground electrode overlapping at least part of said power supply lines in a lamination direction;
   a second ground electrode being arranged on the opposite side of said first ground electrode with respect to said power supply line layer, said second ground electrode overlapping at least part of said power supply lines in a lamination direction; and
   said high-frequency-signal-treating circuits being arranged on the opposite side of said power supply line layer with respect to said second ground electrode.

2. The high-frequency device according to claim 1, wherein said terminals are arranged along the edges of said main surface, with said first ground electrode inside said terminals on said main surface.

3. The high-frequency device according to claim 1, wherein at least part of said power supply terminals overlap said second ground electrode in a lamination direction.

4. The high-frequency device according to claim 1, wherein said other ends of the power supply lines are connected to said high-frequency-signal-treating circuits through via-electrodes formed in a region overlapping said first ground electrode in a lamination direction.

5. The high-frequency device according to claim 1, wherein at least some of the power supply terminals are adjacent to each other.

6. The high-frequency device according to claim 1, wherein signal lines connected to said input and output terminals of high-frequency signals are not formed on said power supply line layer.

7. The high-frequency device according to claim 1, wherein grounded via-electrodes are arranged between power supply lines each having one end connected to each of the power supply terminals of said amplifier circuits and power supply lines each having one end connected to each of the power supply terminals of said switch circuits, which are formed on said power supply line layer.

8. The high-frequency device according to claim 1, wherein at least one signal line connected to said input and output terminals of high-frequency signals are formed in a region not overlapping said first ground electrode on said power supply line layer in a lamination direction.

9. The high-frequency device according to claim 1, wherein some of said power supply lines are constituted by a first line portion formed on the opposite side of said power supply line layer with respect to said second ground electrode, and
   second line portions formed on said power supply line layer and connected to both ends of the first line portion through via-electrodes, said first line portion crossing the other power supply lines on said power supply line layer when viewed from above in a lamination direction.

10. The high-frequency device according to claim 1, comprising a power supply terminal common to pluralities of amplifier circuits.

11. The high-frequency device according to claim 1, comprising a low-noise amplifier circuit as said amplifier circuit, one power supply terminal being commonly used for said switch circuits and said low-noise amplifier circuit.

12. The high-frequency device according to claim 1, wherein said input and output terminals of high-frequency signals and said power supply terminals are arranged via other terminals.

13. The high-frequency device according to claim 1, wherein said switch circuit switches the connection of an antenna terminal to the input and output terminals of said high-frequency signals, and
   wherein said amplifier circuit comprises a high-frequency amplifier circuit for amplifying transmitting signals input to said input terminal, and/or a low-noise amplifier circuit for amplifying received signals input through said antenna terminal.

14. A communications apparatus comprising the high-frequency device recited in claim 1.

15. The high-frequency device according to claim 1, wherein the one main surface is a surface of one of the rectangular dielectric layers facing the laminate direction, and
   the terminals of high-frequency signals, the power supply terminals of said amplifier circuits, the power supply terminals of said switch circuits and the first ground electrode are formed on the one main surface.

* * * * *